(12) United States Patent
Zhang et al.

(10) Patent No.: US 9,887,414 B2
(45) Date of Patent: Feb. 6, 2018

(54) DEPOSITION OF LICOO₂

(71) Applicants: Hongmei Zhang, San Jose, CA (US); R. Ernest Demaray, Portola Valley, CA (US)

(72) Inventors: Hongmei Zhang, San Jose, CA (US); R. Ernest Demaray, Portola Valley, CA (US)

(73) Assignee: DEMARAY, LLC, Portola Valley, CA (US)

( * ) Notice: Subject to any disclaimer, the term of this patent is extended or adjusted under 35 U.S.C. 154(b) by 959 days.

(21) Appl. No.: 14/136,842

(22) Filed: Dec. 20, 2013

(65) Prior Publication Data
US 2014/0102878 A1  Apr. 17, 2014

Related U.S. Application Data

(62) Division of application No. 11/297,057, filed on Dec. 7, 2005, now Pat. No. 8,636,876.

(Continued)

(51) Int. Cl.
*C23C 14/35*  (2006.01)
*H01M 4/04*  (2006.01)
(Continued)

(52) U.S. Cl.
CPC ........... *H01M 4/0426* (2013.01); *C23C 14/08* (2013.01); *C23C 14/35* (2013.01); *C23C 14/5806* (2013.01); *H01M 4/0423* (2013.01); *H01M 4/0428* (2013.01); *H01M 4/0471* (2013.01); *H01M 4/131* (2013.01); *H01M 4/1391* (2013.01); *H01M 4/525* (2013.01); *H01M 4/66* (2013.01); *H01M 4/661* (2013.01); *H01M 4/667* (2013.01); *H01M 6/185* (2013.01);
(Continued)

(58) Field of Classification Search
CPC ..... C23C 14/08; C23C 14/35; C23C 14/5806; H01M 10/052; H01M 10/0562; H01M 10/0585
USPC .......................... 204/192.12, 192.15, 192.22
See application file for complete search history.

(56) References Cited

U.S. PATENT DOCUMENTS 5,292,393 A * 3/1994 Maydan ............ H01L 21/67201
                                                        118/715
6,558,536 B2 * 5/2003 Jainek .................... B01D 29/21
                                                        165/119

(Continued)

FOREIGN PATENT DOCUMENTS

WO     WO 01/073868      * 10/2001

*Primary Examiner* — Rodney McDonald
(74) *Attorney, Agent, or Firm* — Haynes and Boone, LLP

(57) ABSTRACT

In accordance with the present invention, deposition of LiCoO₂ layers in a pulsed-dc physical vapor deposition process is presented. Such a deposition can provide a low-temperature, high deposition rate deposition of a crystalline layer of LiCoO₂ with a desired <101> or <003> orientation. Some embodiments of the deposition address the need for high rate deposition of LiCoO₂ films, which can be utilized as the cathode layer in a solid state rechargeable Li battery. Embodiments of the process according to the present invention can eliminate the high temperature (>700° C.) anneal step that is conventionally needed to crystallize the LiCoO₂ layer.

13 Claims, 15 Drawing Sheets

Related U.S. Application Data

(60) Provisional application No. 60/651,363, filed on Feb. 8, 2005, provisional application No. 60/634,818, filed on Dec. 8, 2004.

(51) Int. Cl.

| | | |
|---|---|---|
| *C23C 14/08* | (2006.01) | |
| *C23C 14/58* | (2006.01) | |
| *H01M 4/131* | (2010.01) | |
| *H01M 4/1391* | (2010.01) | |
| *H01M 4/525* | (2010.01) | |
| *H01M 4/66* | (2006.01) | |
| *H01M 6/18* | (2006.01) | |
| *H01M 6/46* | (2006.01) | |
| *H01M 10/052* | (2010.01) | |
| *H01M 10/0562* | (2010.01) | |
| *H01M 10/0585* | (2010.01) | |
| *H01M 4/02* | (2006.01) | |

(52) U.S. Cl.
 CPC ............. *H01M 6/188* (2013.01); *H01M 6/46* (2013.01); *H01M 10/052* (2013.01); *H01M 10/0562* (2013.01); *H01M 10/0585* (2013.01); *H01M 2004/028* (2013.01); *H01M 2300/002* (2013.01); *H01M 2300/0071* (2013.01); *Y10T 29/49115* (2015.01)

(56) References Cited

U.S. PATENT DOCUMENTS 7,959,769 B2 *  6/2011  Zhang .................... C23C 14/08
                                                     204/192.12
8,636,876 B2 *  1/2014  Zhang .................... C23C 14/08
                                                     204/192.12

* cited by examiner

| CURRENT COLLECTOR | |
|---|---|
| ⋮ | |
| CURRENT COLLECTOR | 603 |
| LiCoO$_2$ | 602 |
| LiPON | 901 |
| ANODE | 902 |
| CURRENT COLLECTOR | 903 |
| ANODE | 902 |
| LiPON | 901 |
| LiCoO$_2$ | 602 |
| CURRENT COLLECTOR | 603 |
| SUBSTRATE | 601 |

FIG. 9A

| CURRENT COLLECTOR | 603 |
|---|---|
| ⋮ | |
| CURRENT COLLECTOR | 903 |
| ANODE | 902 |
| LiPON | 607 |
| LiCoO$_2$ | 602 |
| CURRENT COLLECTOR | 903 |
| ANODE | 902 |
| LiPON | 901 |
| LiCoO$_2$ | 602 |
| CURRENT COLLECTOR | 603 |
| SUBSTRATE | 601 |

FIG. 9B

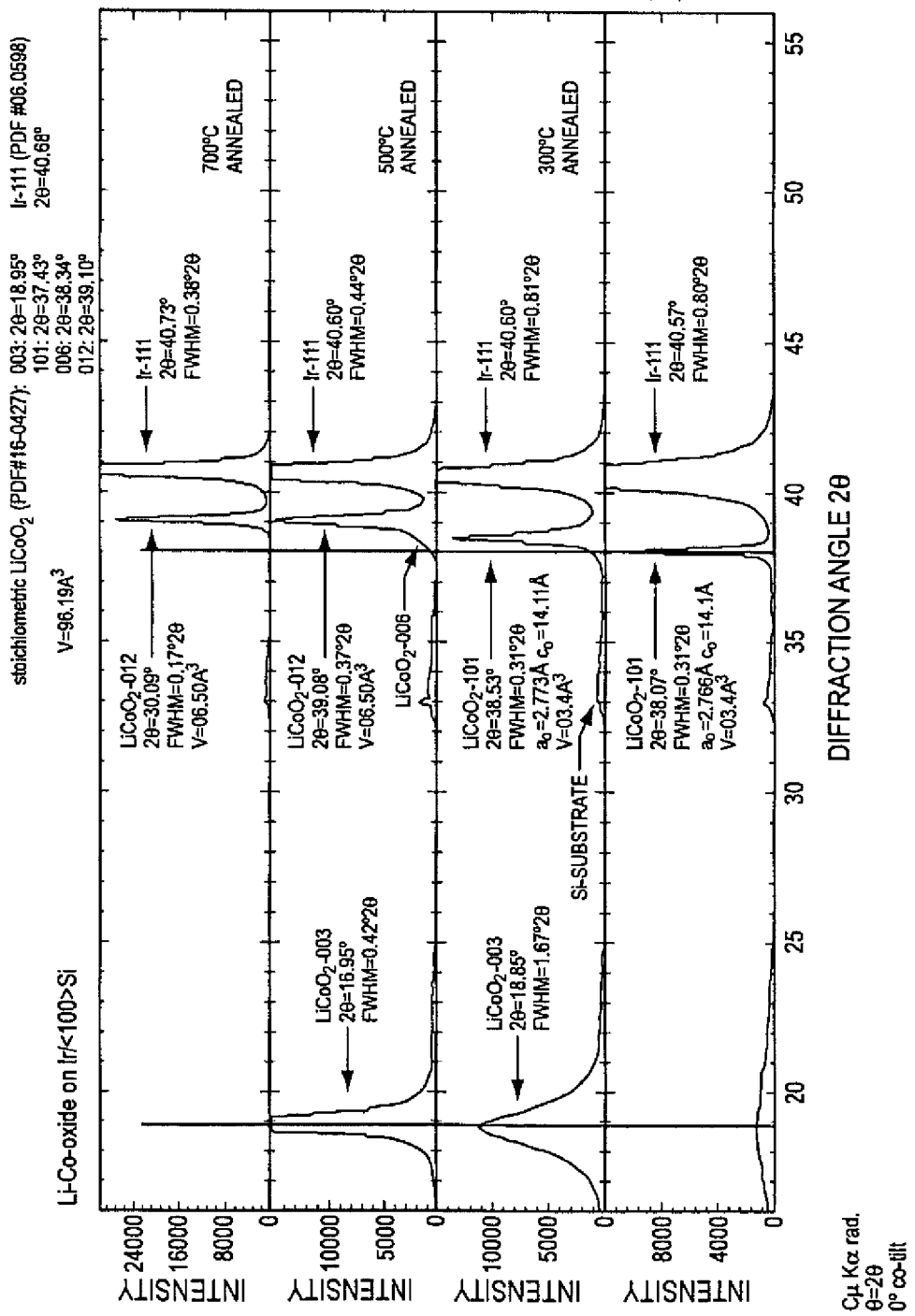

1

DEPOSITION OF LICOO$_2$

RELATED APPLICATION

This application is a divisional application of U.S. patent application Ser. No. 11/297,057, filed on Dec. 7, 2005, which claims priority to Provisional Application No. 60/651,363, filed on Feb. 8, 2005, by Hongmei Zhang and Richard E. Demaray, and to Provisional Application No. 60/634,818, filed on Dec. 8, 2004, by the same inventors. Each of these applications is herein incorporated by reference in its entirety.

BACKGROUND

1. Field of the Invention

The present invention is related to thin-film solid-state batteries and, in particular, the deposition of LiCoO$_2$ films and layers for battery manufacture.

2. Discussion of Related Art

Solid-state thin-film batteries are typically formed by stacking thin films on a substrate in such a way that the films cooperate to generate a voltage. The thin films typically include current collectors, a cathode, an anode, and an electrolyte. The thin films can be deposited utilizing a number of deposition processes, including sputtering and electroplating. Substrates suitable for this application have conventionally been high temperature materials capable of withstanding at least one high temperature anneal process to at least 700° C. for up to about 2 hours in air so as to crystallize the LiCoO$_2$ film. Such a substrate can be any suitable material with appropriate structural and material properties, for example a semiconductor wafer, metallic sheet (e.g., titanium or zirconium), ceramic such as alumina, or other material capable of withstanding subsequent high temperature processing in the presence of the LiCoO$_2$, which can experience significant interfacial reactions with most materials utilized in a battery during these temperature cycles.

Other lithium containing mixed metal oxides besides LiCoO$_2$, including Ni, Nb, Mn, V, and sometimes also Co, but including other transition metal oxides, have been evaluated as crystalline energy storage cathode materials. Typically, the cathode material is deposited in amorphous form and then the material is heated in an anneal process to form the crystalline material. In LiCoO$_2$, for example, an anneal at or above 700° C. transforms the deposited amorphous film to a crystalline form. Such a high temperature anneal, however, severely limits the materials that can be utilized as the substrate, induces destructive reaction with the lithium containing cathode material and often requires the use of expensive noble metals such as gold. Such high thermal budget processes high temperatures for extended periods of time) are incompatible with semiconductor or MEM device processing and limit the choice of substrate materials, increase the cost, and decrease the yield of such batteries.

It is known that crystallization of amorphous LiCoO$_2$ on precious metals can be achieved. An example of this Crystallization is discussed in Kim et al., where a conventional furnace anneal at 700° C. for 20 minutes of an amorphous layer of LiCoO$_2$ on a precious metal achieves crystallization of the LiCoO$_2$ material, as shown by x-ray diffraction data. Kim, Han-Ki and Yoon, Young Soo, "Characteristics of rapid-thermal-annealed LiCoO$_2$, cathode film for an all-solid-state thin film microbattery," J. Vac. Sci. Techn. A 22(4), July/August 2004. In Kim et al., the LiCoO$_2$ film was deposited on a platinum film that was deposited on a high-temperature MgO/Si substrate. In Kim et al, it was shown that such a crystalline film is capable of constituting the Li+ ion containing cathode layer of a functional all solid-state Li+ ion battery.

There are many references that disclose an ion beam assisted process that can provide a LiCoO$_2$ film that demonstrates some observable crystalline composition by low angle x-ray diffraction (XRD). Some examples of these are found in U.S. patent application Ser. No. 09/815,983 (Publication No. US 2002/001747), Ser. No. 09/815,621 (Publication No. US 2001/0032666), and Ser. No. 09/815,919 (Publication No. US 2002/0001746). These references disclose the use of a second front side ion beam or other ion source side-by-side with a deposition source so as to obtain a region of overlap of the flux of ions with the flux of LiCoO$_2$ vapor at the substrate surface. None of these references disclose film temperature data or other temperature data of the film during deposition to support an assertion of low temperature processing.

It is very difficult to form a uniform deposition either by sputtering a material layer or by bombardment with an ion flux. Utilization of two uniform simultaneous distributions from two sources that do not occupy the same position and extent with respect to the substrate enormously increases the difficulties involved in achieving a uniform material deposition. These references do not disclose a uniform materials deposition, which is required for reliable production of thin-film batteries. A well understood specification for material uniformity for useful battery products is that a 5% one-sigma material uniformity is standard in thin film manufacturing. About 86% of the films with this uniformity will be found acceptable for battery production.

It is even more difficult to scale a substrate to manufacturing scale, such as 200 mm or 300 mm. Indeed, in the references discussed above that utilize both a sputtering deposition and an ion beam deposition, only small area targets and small area substrates are disclosed. These references disclose a single feasibility result. No method for achieving a uniform distribution from two separate front side sources has been disclosed in these references.

Further, conventional materials and production processes can limit the energy density capacity of the batteries produced, causing a need for more batteries occupying more volume. It is specifically desirable to produce batteries that have large amounts of stored energy per unit volume in order to provide batteries of low weight and low volume.

Therefore, there is a need for a low temperature process for depositing crystalline material, for example LiCoO$_2$ material, onto a substrate. In particular, there is a need for processes that allow production of cathodic lithium films for a battery structure with a low enough thermal budget to allow production of functional structures on low temperature materials such as stainless steel, aluminum, or copper foil.

SUMMARY

In accordance with the present invention, deposition of LiCoO$_2$ layers in a pulsed-dc physical vapor deposition process is presented. Such a deposition can provide a low-temperature, high deposition rate deposition of a crystalline layer of LiCoO$_2$ with a desired <101> orientation. Some embodiments of the deposition address the need for high rate deposition of LiCoO$_2$ films, which can be utilized as the cathode layer in a solid state rechargeable Li battery. Embodiments of the process according to the present invention can eliminate the high, temperature (>700° C.) anneal step that is conventionally needed to crystallize the $LiCoO_2$ layer.

A method of depositing a $LiCoO_2$ layer according to some embodiments of the present invention includes placing a substrate in a reactor; flowing a gaseous mixture including argon and oxygen through the reactor; and applying pulsed-DC power to a target formed of $LiCoO_2$ positioned opposite the substrate. In some embodiments, a $LiCoO_2$ layer is formed on the substrate. Further, in some embodiments the $LiCoO_2$ layer is a crystalline layer of orientation <101>.

In some embodiments, a stacked battery structure can be formed. The stacked battery structure includes one or more battery stacks deposited on a thin substrate, wherein each battery stack includes: a conducting layer, a crystalline $LiCoO_2$ layer deposited over the conducting layer, a LiPON layer deposited over the $LiCoO_2$ layer; and an anode deposited over the LiPON layer. A top conducting layer can be deposited over the one or more battery stacks.

In some embodiments, a battery structure can be formed in a cluster tool. A method of producing a battery in a cluster tool includes loading a substrate into a cluster tool; depositing a conducting layer over the substrate in a first chamber of the cluster tool; depositing a crystalline $LiCoO_2$ layer over the conducting layer in a second chamber of the cluster tool; depositing a LiPON layer over the $LiCoO_2$ layer in a third chamber of the cluster tool; depositing an anode layer over the $LiCoO_2$ layer in a fourth chamber; and depositing a second conducting layer over the LiPON layer in a fifth chamber of the cluster tool.

A fixture for holding a thin substrate can include a top portion and a bottom portion, wherein the thin substrate is held when the top portion is attached to the bottom portion.

These and other embodiments of the invention are further discussed below with reference to the following figures. It is to be understood that both the foregoing general description and the following detailed description are exemplary and explanatory only and are not restrictive of the invention, as claimed. Further, specific explanations or theories regarding the deposition or performance of certain layers during deposition processes or in the performance of devices incorporating those layers are presented for explanation only and are not to be considered limiting with respect to the scope of the present disclosure or the claims.

BRIEF DESCRIPTION OF THE DRAWINGS

FIGS. 9A and 9B illustrate examples of stacked batter structures with $LiCoO_2$ layers deposited according to some embodiments of the present invention.

FIGS. 10A through 10D illustrate deposition and anneal steps for $LiCoO_2$ deposited over an iridium layer on a silicon wafer.

Figure 1A:
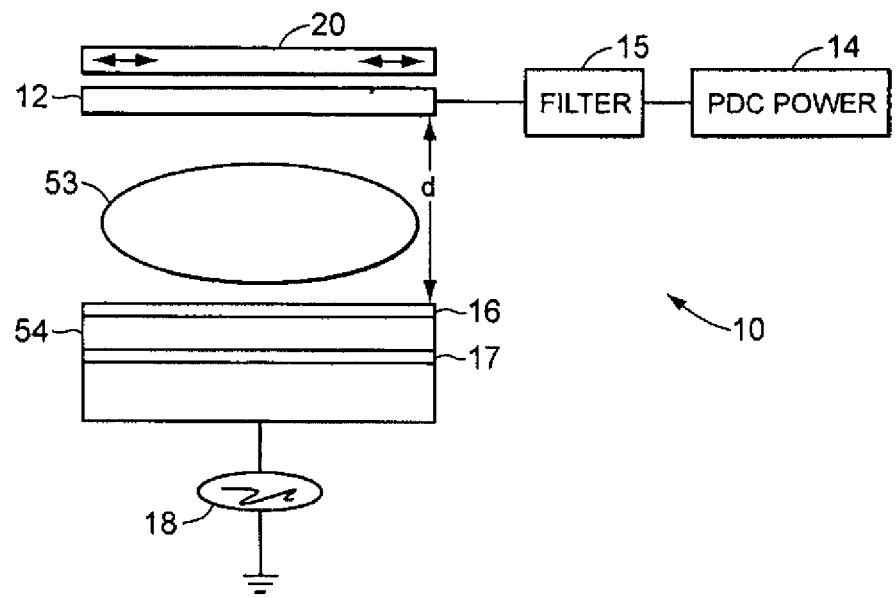
FIGS. 1A and 1B illustrate a pulsed-DC biased reactive deposition apparatus that can be utilized in the methods of depositing according to the present invention.

In the figures, elements having the same designation have the same or similar functions.

DETAILED DESCRIPTION

In accordance with embodiments of the present invention, $LiCoO_2$ films are deposited on a substrate by a pulsed-dc physical vapor deposition (PVD) process. In contrast to, for example, Kim et al., $LiCoO_2$ films according to some embodiments of the present invention provide a crystalline $LiCoO_2$ film as deposited on a substrate at a substrate temperature as low as about 220° C. during deposition, without the use of a metallic nucleation or barrier underlying film. The as-deposited crystalline $LiCoO_2$ films can be easily ripened to very high crystalline condition by anneal. In addition, the as deposited crystalline films, when positioned on a noble metal film can be annealed at much further reduced temperatures, for example as low as 400 to 500° C. instead of 700° C., providing for deposition, annealing, and production of solid state batteries on lower temperature substrates.

In the present application, a single, extended source is described which has been scaled to 400 mm×500 mm for production achieving a high $LiCoO_2$ uniformity at a deposition rate of 1.2 microns thickness an hour over an area of 2000 $cm^2$, without the need for secondary front side ion source or ion assistance.

In one example process, a $LiCoO_2$ film was deposited utilizing a conductive ceramic $LiCoO_2$ target as described herein, with pulsed-dc power of 4 kW, no bias, with 60 sccm Ar and 20 sccm $O_2$ gas flows. A 3000 Angstrom layer of crystalline $LiCoO_2$ was deposited on a substrate area of 400×500 mm.

On other depositions utilizing this process, a temperature measurement of the substrate during deposition showed that the substrate remained at less than 224° C. Temperature measurements were performed utilizing a temperature sticker purchased from Omega Engineering, Stamford, Conn. (Model no. TL-F-390, active from 199-224° C.).

Moreover, in some embodiments, films deposited according to the present invention can have a deposition rate of from about 10 to about 30 times higher than processes in conventional films. Deposition thicknesses and times of deposition for films deposited according to the present invention are illustrated in Table I. Furthermore, films according to the present invention can be deposited on wide area substrates having a surface area from 10 to 50 times the surface area of prior sputtering processes, resulting in much higher productivity and much lower cost of manufacture, thereby providing high-volume, low-cost batteries.

Further, conventional deposition processes without ion sources are capable of depositing amorphous $LiCoO_2$ layers, but do not deposit crystalline $LiCoO_2$ layers. Surprisingly, depositions according to some embodiment of the present invention, deposit a $LiCoO_2$ layer with substantial crystallinity readily measured by x-ray diffraction techniques. In some embodiments, the crystallinity of the as-deposited $LiCoO_2$ layers is sufficient to be utilized in a battery structure with no further thermal processing. In some embodiments, crystallinity of the as-deposited $LiCoO_2$ layers are improved by thermal processes with low thermal budgets, which can be compatible with films deposited on low-temperature substrates.

Further, as-deposited the stoichiometry of some $LiCoO_2$ layers deposited according to some embodiments of the present invention shows that this layer is sufficient for utilization in a battery. With the demonstrated ability to deposit a $LiCoO_2$ film with crystallinity and with sufficient stoichiometry, a battery utilizing as-deposited $LiCoO_2$ films can be produced. Heat treating the $LiCoO_2$ layers may improve the crystallinity and lower the impedance.

In some embodiments, a crystalline layer of $LiCoO_2$ with a <101> or a <003> crystalline orientation is deposited directly on the substrate. Deposition of crystalline material can eliminate or lessen the need of a subsequent high temperature anneal or precious-metal layers to crystallize and orient the film. Removing the high temperature anneal allows for formation of battery structures on light-weight and low temperature substrates such as stainless steel foil, copper foil, aluminum foil, and plastic sheet, reducing both the weight and the cost of batteries while retaining the energy density storage capabilities of Li-based batteries. In some embodiments, a crystalline $LiCoO_2$ layer can be deposited on a precious metal layer, such as iridium, resulting in a further significant lowering of the ripening thermal budget required to improve crystallinity.

Deposition of materials by pulsed-DC biased reactive ion deposition is described in U.S. patent application Ser. No. 10/101,863, entitled "Biased Pulse DC Reactive Sputtering of Oxide Films," to Hongmei Zhang, et al., filed on Mar. 16, 2002. Preparation of targets is described in U.S. patent application Ser. No. 10/101,341, entitled "Rare-Earth Pre-Alloyed PVD Targets for Dielectric Planar Applications," to Vassiliki Milonopoulou, et al., filed on Mar. 16, 2002. U.S. patent application Ser. No. 10/101,863 and U.S. patent application Ser. No. 10/101,341 are each assigned to the same assignee as is the present disclosure and each is incorporated herein in their entirety. Deposition of oxide materials has also been described in U.S. Pat. No. 6,506,289, which is also herein incorporated by reference in its entirety. Transparent oxide films can be deposited utilizing processes similar to those specifically described in U.S. Pat. No. 6,506,289 and U.S. application Ser. No. 10/101,863.

FIG. 1A shows a schematic of a reactor apparatus 10 for sputtering material from a target 12 according to the present invention. In some embodiments, apparatus 10 may, for example, be adapted from an AKT-1600 PVD (400×500 mm substrate size) system from Applied Komatsu or an AKT-4300 (600×720 mm substrate size) system from Applied Komatsu, Santa Clara, Calif. The AKT-1600 reactor, for example, has three deposition chambers connected by a vacuum transport chamber. These AKT reactors can be modified such that pulsed DC power is supplied to the target and RF power is supplied to the substrate during deposition of a material film.

Apparatus 10 includes target 12 which is electrically coupled through a filter 15 to a pulsed DC power supply 14. In some embodiments, target 12 is a wide area sputter source target, which provides material to be deposited on a substrate 16. Substrate 16 is positioned parallel to and opposite target 12. Target 12 functions as a cathode when power is applied to it from the pulsed DC power supply 14 and is equivalently termed a cathode. Application of power to target 12 creates a plasma 53. Substrate 16 is capacitively coupled to an electrode 17 through an insulator 54. Electrode 17 can be coupled to an RF power supply 18. A magnet 20 is scanned across the top of target 12.

For pulsed reactive dc magnetron sputtering, as performed by apparatus 10, the polarity of the power supplied to target 12 by power supply 14 oscillates between negative and positive potentials. During the positive period, the insulating layer on the surface of target 12 is discharged and arcing is prevented. To obtain arc free deposition, the pulsing frequency exceeds a critical frequency that can depend on target material, cathode current and reverse time. High quality oxide films can be made using reactive pulse DC magnetron sputtering as shown in apparatus 10.

Pulsed DC power supply 14 can be any pulsed DC power supply, for example an AE Pinnacle plus 10K by Advanced Energy, Inc. With this DC power supply, up to 10 kW of pulsed DC power can be supplied at a frequency of between 0 and 350 kHz. The reverse voltage can be 10% of the negative target voltage. Utilization of other power supplies can lead to different power characteristics, frequency characteristics, and reverse voltage percentages. The reverse time on this embodiment of power supply 14 can be adjusted between 0 and 5 μs.

Filter 15 prevents the bias power from power supply 18 from coupling into pulsed DC power supply 14. In some embodiments, power supply 18 can be a 2 MHz RF power supply, for example a Nova-25 power supply made by ENI, Colorado Springs, Co.

In some embodiments, filter 15 can be a 2 MHz sinusoidal band rejection filter. In some embodiments, the band width of the filter can be approximately 100 kHz. Filter 15, therefore, prevents the 2 MHz power from the bias to substrate 16 from damaging power supply 14 and allow passage of the pulsed-dc power and frequency.

Pulsed DC deposited films are not fully dense and may have columnar structures. Columnar structures can be detrimental to thin film applications such as barrier films and dielectric films, where high density is important, due to the boundaries between the columns. The columns act to lower the dielectric strength of the material, but may provide diffusion paths for transport or diffusion of electrical current, ionic current, gas, or other chemical agents such as water. In the case of a solid state battery, a columnar structure containing crystallinity as derived from processes according to the present invention is beneficial for battery performance because it allows better Li transport through the boundaries of the material.

In the deposition system, target 12 can have an active size of about 675.7×582.48 mm by 4 to 8 mm in order to deposit films on substrate 16 that have dimension about 400×500 mm. The temperature of substrate 16 can be adjusted to between −50° C. and 500° C. The distance between target 12 and substrate 16 can be between about 3 and about 9 cm (in some embodiments, between 4.8 and 6 cm are used). Process gas can be inserted into the chamber of apparatus 10 at a rate up to about 200 sccm while the pressure in the chamber of apparatus 10 can be held at between about 0.7 and 6 milliTorr. Magnet 20 provides a magnetic field of strength between about 400 and about 600 Gauss directed in the plane of target 12 and is moved across target 12 at a rate of less than about 20-30 sec/scan. In some embodiments utilizing the AKT reactor, magnet 20 can be a race-track shaped magnet with dimensions about 150 mm by 600 mm.

Figure 1B:
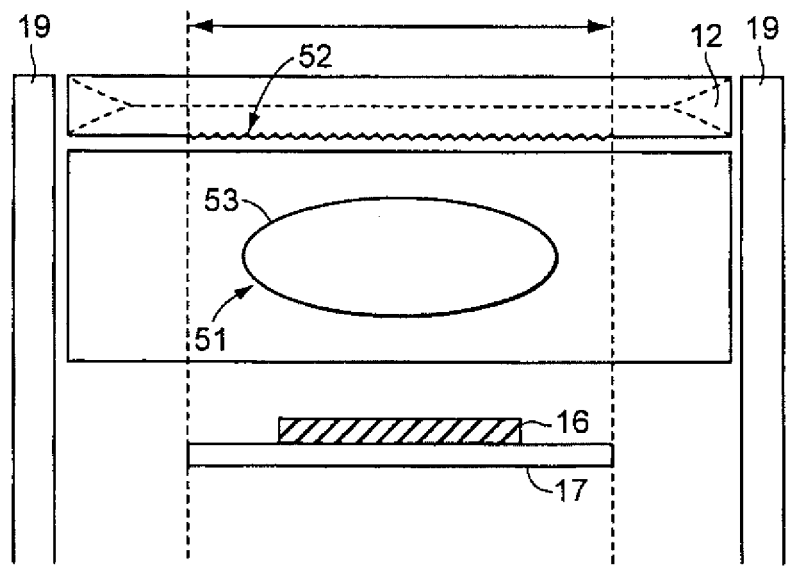
Figure 2:
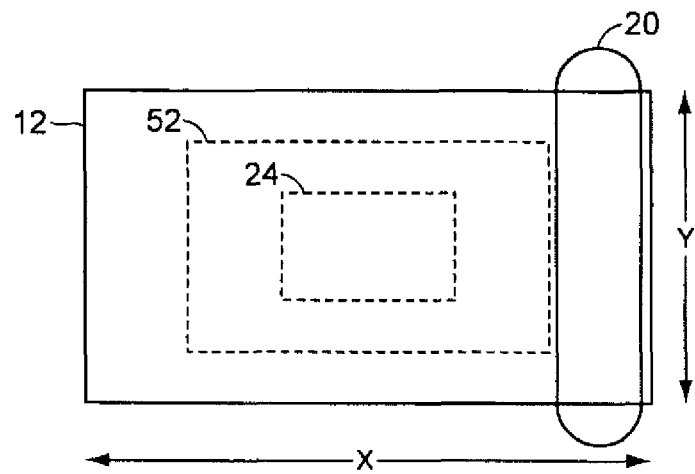
FIG. 2 shows an example of a target that can be utilized in the reactor illustrated in FIGS. 1A and 1B.

FIG. 2 illustrates an example of target 12. A film deposited on a substrate positioned on carrier sheet 17 directly opposed to region 52 of target 12 has good thickness uniformity. Region 52 is the region shown in FIG. 1B that is exposed to a uniform plasma condition. In some implementations, carrier 17 can be coextensive with region 52. Region 24 shown in FIG. 2 indicates the area below which both physically and chemically uniform deposition can be achieved, for example where physical and chemical uniformity provide refractive index uniformity, oxide film uniformity, or metallic film uniformity. FIG. 2 indicates region 52 of target 12 that provides thickness uniformity, which is, in general, larger than region 24 of target 12 providing thickness and chemical uniformity to the deposited film. In optimized processes, however, regions 52 and 24 may be coextensive.

In some embodiments, magnet 20 extends beyond area 52 in one direction, for example the Y direction in FIG. 2, so that scanning is necessary in only one direction, for example the X direction, to provide a time averaged uniform magnetic field. As shown in FIGS. 1A and 1B, magnet 20 can be scanned over the entire extent of target 12, which is larger than region 52 of uniform sputter erosion. Magnet 20 is moved in a plane parallel to the plane of target 12.

The combination of a uniform target 12 with a target area 52 larger than the area of substrate 16 can provide films of highly uniform thickness. Further, the material properties of the film deposited can be highly uniform. The conditions of sputtering at the target surface, such as the uniformity of erosion, the average temperature of the plasma at the target surface, and the equilibration of the target surface with the gas phase ambient of the process are uniform over a region which is greater than or equal to the region to be coated with a uniform film thickness. In addition, the region of uniform film thickness is greater than or equal to the region of the film which is to have highly uniform electrical, mechanical, or optical properties such as index of refraction, stoichiometry, density, transmission, or absorptivity.

Target 12 can be formed of any materials that provide the correct stoichiometry for $LiCoO_2$ deposition. Typical ceramic target materials include oxides of Li and Co as well as metallic Li and Co additions and dopants such as Ni, Si, Nb, or other suitable metal oxide additions. In the present disclosure, target 12 can be formed from $LiCoO_2$ for deposition of $LiCoO_2$ film.

In some embodiments of the invention, material tiles are formed. These tiles can be mounted on a backing plate to form a target for apparatus 10. A wide area sputter cathode target can be formed from a close packed array of smaller tiles. Target 12, therefore, may include any number of tiles, for example between 2 and 60 individual tiles. Tiles can be finished to a size so as to provide a margin of edge-wise non-contact, tile to tile, less than about 0.010" to about 0.020" or less than half a millimeter so as to eliminate plasma processes that may occur between adjacent ones of tiles 30. The distance between tiles of target 12 and the dark space anode or ground shield 19 in FIG. 1B can be somewhat larger so as to provide non contact assembly or to provide for thermal expansion tolerance during process chamber conditioning or operation.

As shown in FIG. 1B, a uniform plasma condition can be created in the region between target 12 and substrate 16 in a region overlying substrate 16. A plasma 53 can be created in region 51, which extends under the entire target 12. A central region 52 of target 12 can experience a condition of uniform sputter erosion. As discussed further herein, a layer deposited on a substrate placed anywhere below central region 52 can then be uniform in thickness and other properties (i.e., dielectric, optical index, or material concentrations). In some embodiments, target 12 is substantially planar in order to provide uniformity in the film deposited on substrate 16. In practice, planarity of target 12 can mean that all portions of the target surface in region 52 are within a few millimeters of a planar surface, and can be typically within 0.5 mm of a planar surface.

Figure 3:
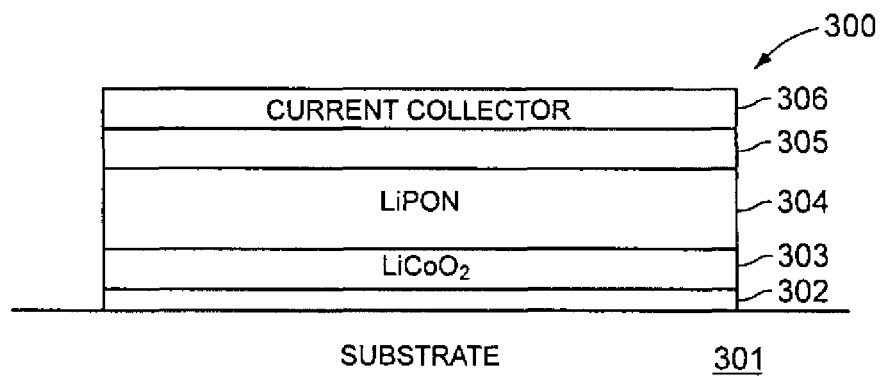
FIG. 3 illustrates a thin-film battery design according to some embodiments of the present invention.

FIG. 3 shows a battery structure with a $LiCoO_2$ layer deposited according to some embodiments of the present invention. As shown in FIG. 3, a metallic current collection layer 302 is deposited on a substrate 301. In some embodiments, current collection layer 302 can be patterned in various ways before deposition of a $LiCoO_2$ layer 303. Also according to some embodiments, $LiCoO_2$ layer 303 can be a deposited crystalline layer. In some embodiments of the invention, layer 303 is crystalline without the necessity of a crystallizing heat treatment. Therefore, substrate 301 can be a silicon wafer, titanium metal, alumina, or other conventional high temperature substrate, but may also be a low temperature material such as plastic, glass, or other material which could be susceptible to damage from the high temperature crystallizing heat treatment. This feature can have the great advantage of decreasing the expense and weight of battery structures formed by the present invention. The low temperature deposition of the $LiCoO_2$ allows for successive depositions of battery layers, one upon another. Such a process would have the advantage that successive layers of battery structure would be obtained in a stacked condition without the inclusion of a substrate layer. The stacked layered battery would provide higher specific energy density as well as low impedance operation for charging and discharging.

In some embodiments, an oxide layer can be deposited on substrate 301. For example, a silicon oxide layer can be deposited on a silicon wafer. Other layers can be formed between conducting layer 302 and substrate 301.

As further shown in FIG. 3, a LiPON layer 304 ($Li_xPO_yN_z$) is deposited over $LiCoO_2$ layer 303. LiPON layer 304 is the electrolyte for battery 300 while $LiCoO_2$ layer 303 acts as the cathode. A metallic conducting layer 305 can be deposited over the LiPON layer 304 in order to complete the battery. Metallic conducting layer 305 can include lithium adjacent to LiPON layer 304.

An anode 305 is deposited over LiPON layer 304. Anode 305 can be, for example an evaporated lithium metal. Other materials such as, for example, nickel can also be utilized. A current collector 306, which is a conducting material, is then deposited over at least a portion of anode 305.

A Li based thin film battery operates by transport of Li ions in the direction from current collector 306 to current collector 302 in order to hold the voltage between current collector 306 and current collector 302 at a constant voltage. The ability for battery structure 300 to supply steady current, then, depends on the ability of Li ions to diffuse through LiPON layer 304 and $LiCoO_2$ layer 303. Li transport through bulk cathode $LiCoO_2$ layer 303 in a thin film battery occurs by the way of grains or grain boundaries. Without being restricted in this disclosure to any particular theory of transport, it is believed that the grains with their planes parallel to substrate 302 will block the flow of Li ions while grains oriented with planes perpendicular to substrate 301

(i.e., oriented parallel to the direction of Li ion flow) facilitate the Li diffusion. Therefore, in order to provide a high-current battery structure, $LiCoO_2$ layer 303 should include crystals oriented in the <101> direction or <003> direction.

In accordance with the present invention, $LiCoO_2$ films can be deposited on substrate 302 with a pulsed-DC biased PVD system as was described above. In addition, an AKT 1600 PVD system can be modified to provide an RF bias and an Advanced Energy Pinnacle plus 10K pulsed DC power supply can be utilized to provide power to a target. The pulsing frequency of the power supply can vary from about 0 to about 350 KHz. The power output of the power supply is between 0 and about 10 kW. A target of densified $LiCoO_2$ tiles having a resistivity in the range of about 3 to about 10 k$\Omega$ can be utilized with dc-sputtering.

In some embodiments, $LiCoO_2$ films are deposited on Si wafers. Gas flows containing Oxygen and Argon can be utilized. In some embodiments, the Oxygen to Argon ratio ranges from 0 to about 50% with a total gas flow of about 80 sccm. The pulsing frequency ranges from about 200 kHz to about 300 kHz during deposition. RF bias can also be applied to the substrate. In many trials, the deposition rates vary from about 2 Angstrom/(kW sec) to about 1 Angstrom/(kW sec) depending on the $O_2$/Ar ratio as well as substrate bias.

Table I illustrates some example depositions of $LiCoO_2$ according to the present invention. XRD (x-Ray Diffraction) results taken on the resulting thin films illustrate that films deposited according to the present invention are crystalline films, often with highly textured grain sizes as large as about 150 nm. The dominant crystal orientation appears to be sensitive to the $O_2$/Ar ratio. For certain $O_2$/Ar ratios (~10%), as-deposited films exhibit a preferred orientation in the <101> direction or the <003> direction with poorly developed <003> planes.

Figure 4A:
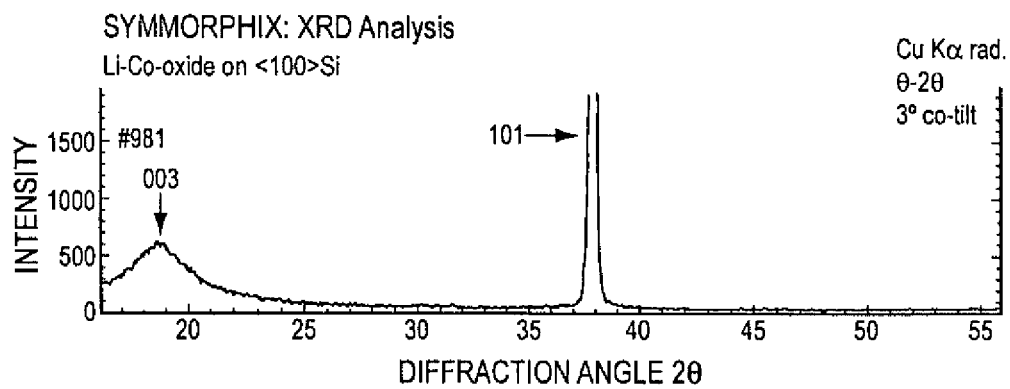
FIGS. 4A and 4B show an x-ray diffraction analysis of and an SEM photograph of a $LiCoO_2$ film deposited according to embodiments of the present invention.
Figure 4B:
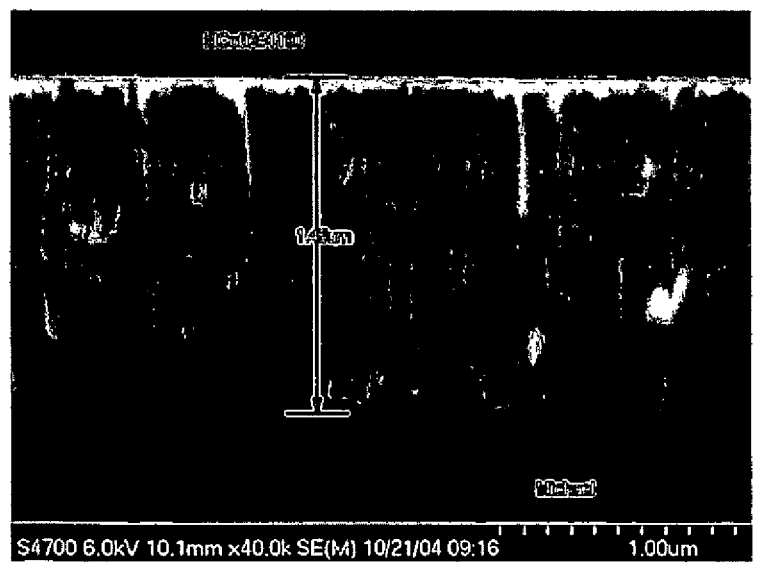

FIGS. 4A and 4B illustrate an XRD Analysis and SEM cross section, respectively, of the $LiCoO_2$ film deposited as Example 15 in Table I. Such a $LiCoO_2$ film was deposited on Si wafer with 2 kW of target power, a frequency of 300 kHz, with 60 sccm Ar and 20 sccm of $O_2$ for a substrate with an initial temperature of about 30° C. As shown in the XRD analysis of FIG. 4A, a strong <101> peak is indicated showing a strong orientation of $LiCoO_2$ crystals in the desired <101> crystallographic direction. The SEM cross section shown in FIG. 4B further shows the columnar structure of the film having the <101> direction and the grain boundaries of the resulting $LiCoO_2$ crystals.

FIGS. 5A through 5E show SEM cross sections of further example depositions of $LiCoO_2$ crystals according to the present invention. In each of the examples, deposition of the $LiCoO_2$ film was performed on a Si wafer with target power of about 2 kW and frequency of about 250 kHz. The $LiCoO_2$ film shown in FIG. 5A corresponds to the example deposition Example 1 in Table I. In the deposition of the $LiCoO_2$ film shown in FIG. 5A, no bias power was utilized with an argon flow rate of about 80 sccm and an oxygen flow rate of about 0 sccm. A deposition rate of about 1.45 μm/hr was achieved over the full substrate area of 400×500 mm. Further, as is indicated in the cross section shown in FIG. 5A, a <101> orientation of the $LiCoO_2$ was achieved.

Figure 5A:
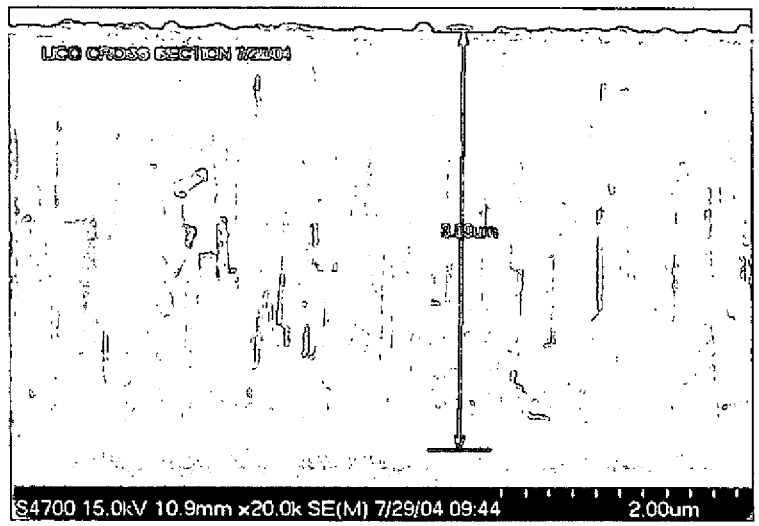
FIGS. 5A through 5E show SEM photographs of $LiCoO_2$ films according to some embodiments of the present invention.

The rate of deposition of the $LiCoO_2$ layer shown in FIG. 5A is very high, likely due to the relatively high conductivity or low resistivity of the ceramic $LiCoO_2$ oxide sputter target. A target resistance of 10 kOhms was measured by means of an Ohm meter over a distance of about 4 cm on the surface of target 12. This high rate allows the manufacture of the 3 micron or thicker $LiCoO_2$ layer required for the battery at high rate over a wide area in short times, resulting in very high productivity and very low cost. Target resistance on the order of about 500 k$\Omega$ over the same distance by the same measurement technique or higher would not allow for such a high sputter efficiency or high rate of deposition at such a low target power. The resistance of conventional target materials can be unmeasurably high. A resistance of 100 k$\Omega$ over about 4 cm of surface will result in high sputter efficiency and high rate of deposition. Further, because deposition rates typically scale nearly linearly with target power, a deposition at 6 kW will yield a deposition rate of approximately 3 μm/hr, which is a very desirable rate of deposition for manufacturability of Li-based thin-film solid-state batteries on a surface area of 400×500 $mm^2$.

Figure 5B:
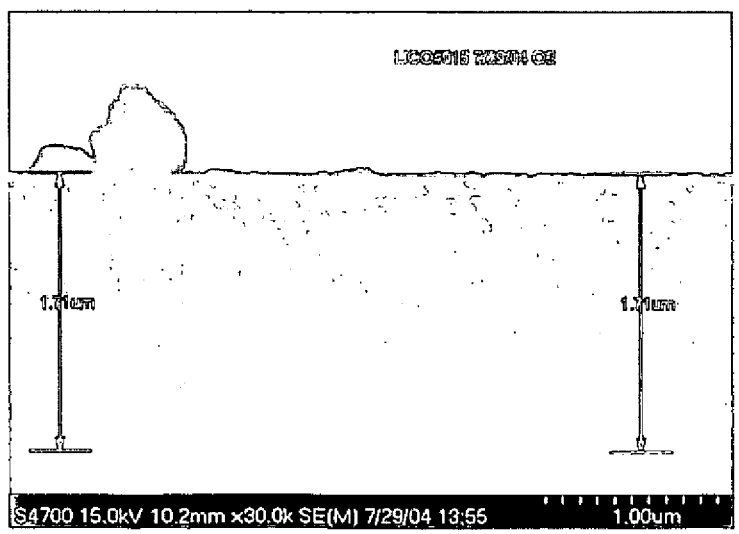

The $LiCoO_2$ layer shown in FIG. 5B is deposited under the conditions listed as Example 7 in Table I. Again, no bias was utilized in the deposition. An argon flow rate of about 72 sccm and an oxygen flow rate of about 8 sccm was utilized. The deposition rate was significantly reduced to about 0.85 μm/hr. Further, although a <101> crystallinity can be discerned, that <101> crystallinity is not as pronounced as that exhibited in the deposition of the film shown in FIG. 5A.

Figure 5C:
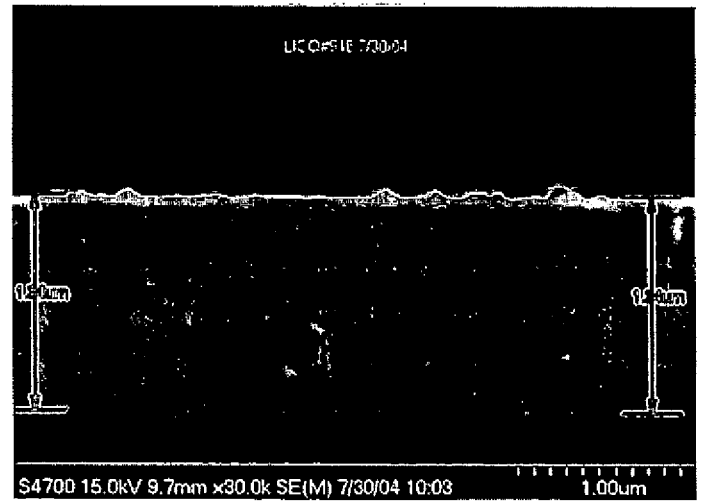

The $LiCoO_2$ film shown in FIG. 5C was deposited according to Example 3 in Table I. In this deposition, 100 W of bias power is applied to the substrate. Further, an argon flow rate of 72 sccm, and an oxygen flow rate of 8 sccm was utilized. The deposition rate was about 0.67 μm/hr. Therefore, the application of bias in comparison with the $LiCoO_2$ film shown in FIG. 5B further reduced the deposition rate (from 0.85 μm/hr of the example shown in FIG. 5B to 0.67 μm/hr of the example shown in FIG. 5C). Further, the desired <101> directionality of formed crystals appears to be further degraded.

Figure 5D:
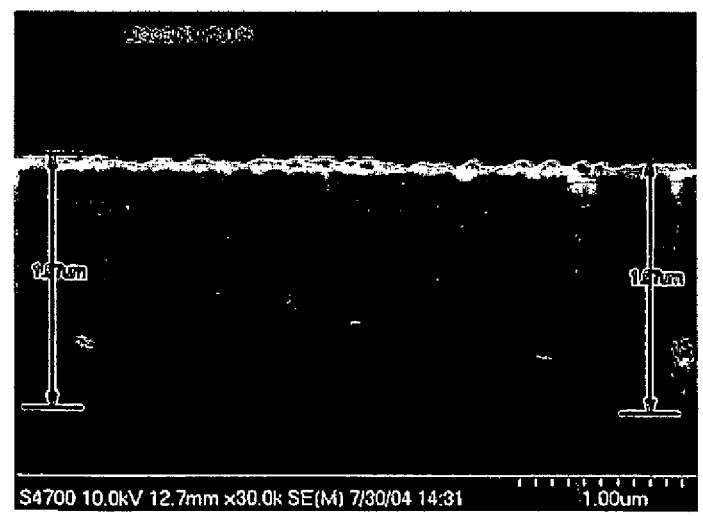

The $LiCoO_2$ film shown in FIG. 5D corresponds to Example 4 in Table I. In this deposition, the Ar/$O_2$ ratio was increased. As is shown in FIG. 5D, increasing the Ar/$O_2$ ratio improves crystallinity. With respect to the example illustrated in FIG. 5C, the deposition illustrated in FIG. 5D was performed with an argon flow of about 76 sccm and an oxygen flow of about 4 sccm as well as retaining the 100 W bias to the substrate. The $LiCoO_2$ deposition rate was improved to 0.79 μm/hr from a rate of 0.67 μm/hr illustrated in FIG. 5C.

Figure 5E:

In the example deposition illustrated in FIG. 5E corresponding to Example 5 in Table I. The substrate temperature was set at about 200° C. while the bias power remained at about 100 W. The argon flow rate was set at about 76 sccm and the oxygen flow rate was set at about 4 sccm. The resulting deposition rate for the $LiCoO_2$ layer was about 0.74 μm/hr.

In Example 6 of Table I, the argon flow rate was set at about 74 sccm and the oxygen flow rate was set at about 6 sccm, resulting in a $LiCoO_2$ deposition rate of about 0.67 μm/hr. Therefore, increasing both argon and oxygen flow rate over the deposition illustrated in FIG. 5E resulted in a lower deposition rate.

The data show clearly that an as-deposited crystalline film of $LiCoO_2$ can be obtained under several of the process conditions, as shown in Table II. In particular, very high rates of deposition with low power are obtained along with the oriented crystalline structure for the process conditions according to embodiments of the present invention.

Figure 6A:
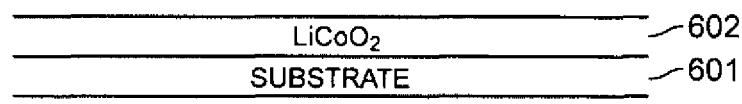
FIG. 6A illustrates a layer of $LiCoO_2$ deposited according to some embodiments of the present invention on a thin substrate.
Figure 6B:
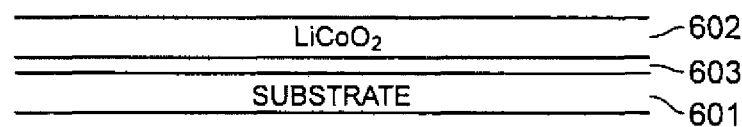
FIG. 6B illustrates a layer of $LiCoO_2$ deposited according to some embodiments of the present invention over a conducting layer on a thin substrate.

FIG. 6A illustrates a layer of $LiCoO_2$ 602 deposited on a thin substrate 601 according to some embodiments of the present invention. Higher lithium-ion mobilities can be achieved utilizing crystalline LiCoO₂ cathode films 602 deposited on a thin substrate 601 that has thickness comparable to that of the battery stack itself, rather than a thickness many or tens of times that of the battery stack. Such a film can lead to faster charging and discharging rates. Substrate 601 can be formed of a thin metallic sheet (e.g., aluminum, titanium, stainless steel, or other suitable thin metallic sheet), can be formed of a polymer or plastic material, or may be formed of a ceramic or glass material. As shown in FIG. 6B, if substrate 601 is an insulating material, a conducting layer 603 can be deposited between substrate 601 and LiCoO₂ layer 602.

Figure 7A:
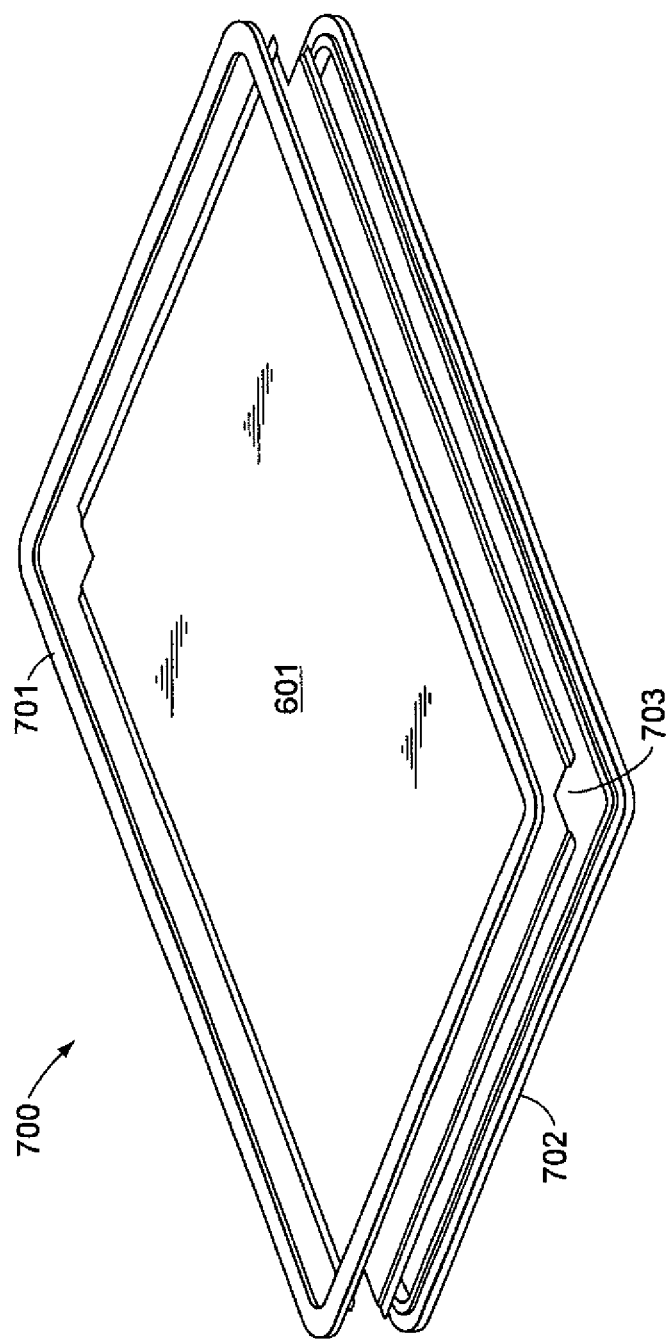
FIGS. 7A, 7B, 7C, and 7D illustrate a thin substrate mount and mask arrangement that can be utilized in the deposition of $LiCoO_2$ layers deposited according to some embodiments of the present invention.
Figure 7B:
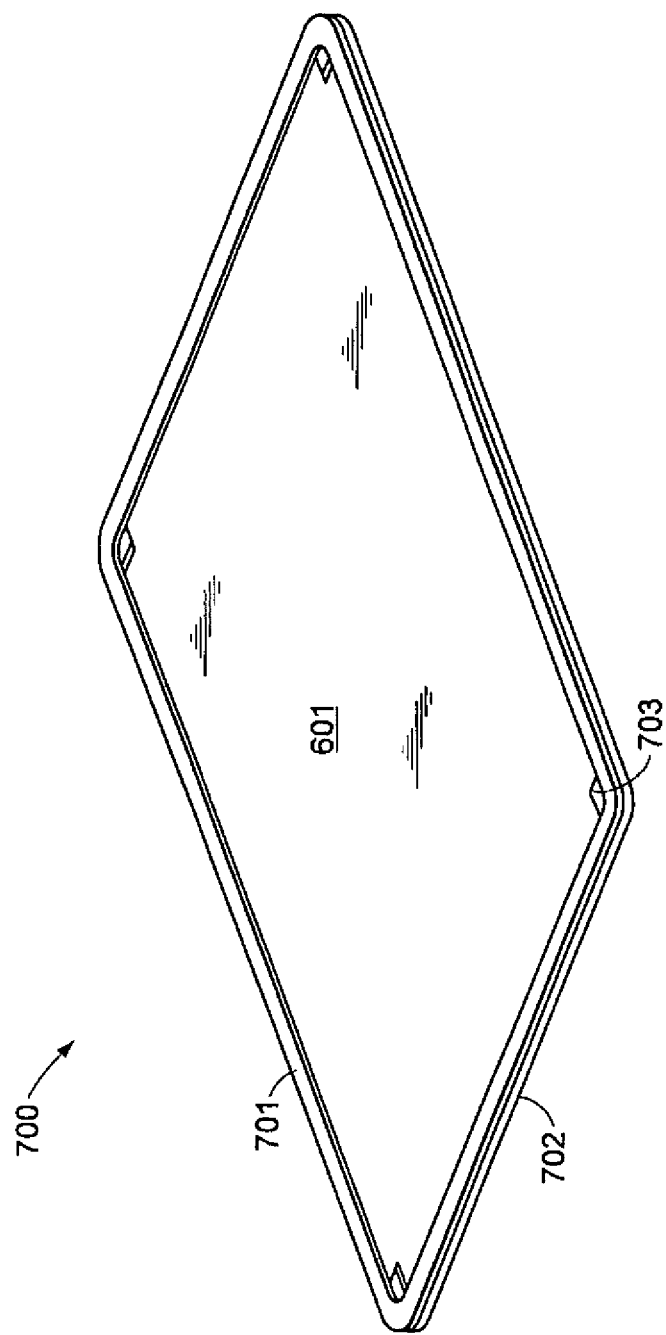

Depositing materials on a thin substrate involves holding and positioning the substrate during deposition. FIGS. 7A, 7B, 7C, and 7D illustrate a reusable fixture 700 for holding a thin film substrate. As shown in FIG. 7A, reusable fixture 700 includes a top portion 701 and a bottom portion 702 that snap together. Thin substrate 601 is positioned between top portion 701 and bottom portion 702. As shown in FIG. 7B, top portion 701 and bottom portion 702 are such that substrate 601 is brought into tension and subsequently clamped as top portion 701 is closed into bottom portion 702. Substrate 601 can be easily held by fixture 700 so that substrate 601 can be handled and positioned. In some embodiments, the corners of substrate 601, areas 703, are removed so that substrate 601 is more easily stretched by avoiding "wrap-around" corner clamping effects when top portion 701 is closed into bottom portion 702.

Figure 7C:
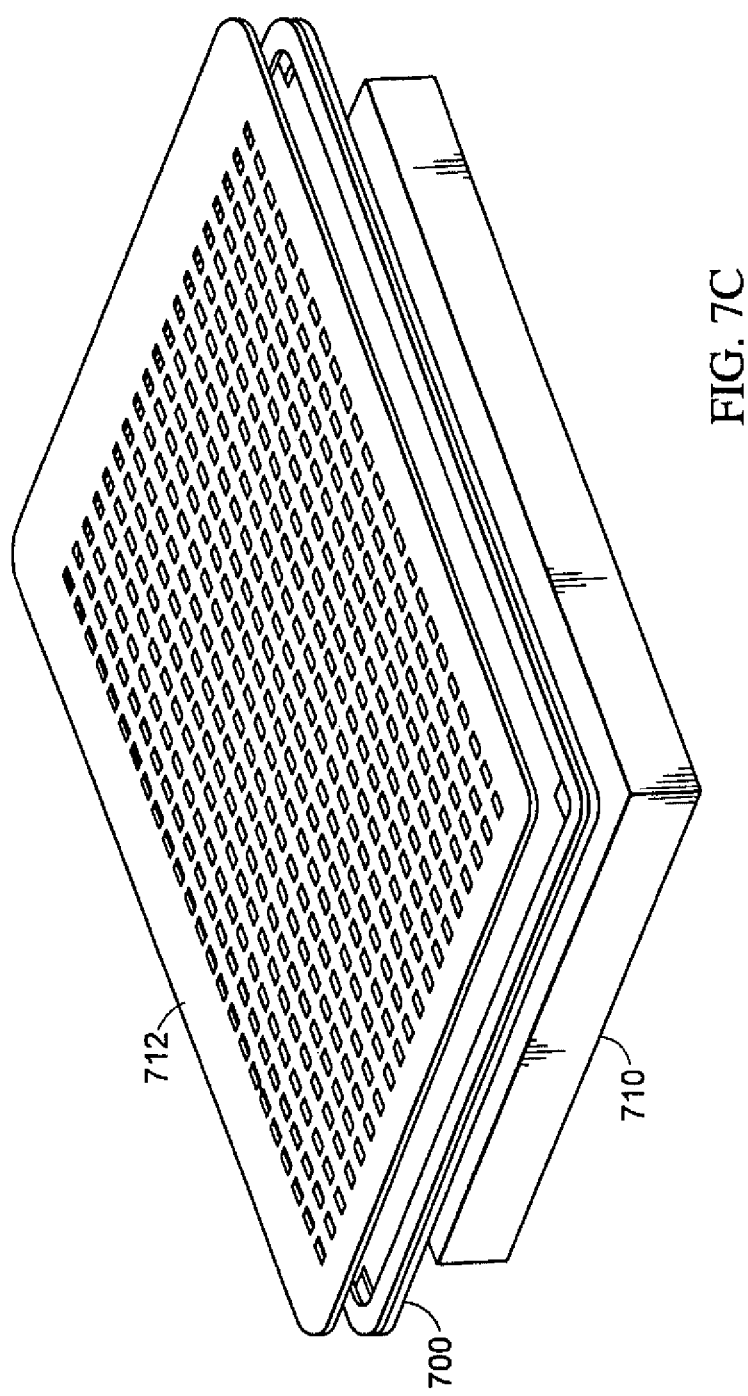

As shown in FIG. 7C, a mask 712 can be attached to fixture 700. In some embodiments, fixture 700 includes guides in order to align fixture 700 with respect to mask 712. In some embodiments, mask 712 may be attached to fixture 700 and travel with fixture 700. Mask 712 can be positioned at any desired height above substrate 601 in fixture 700. Therefore, mask 712 can function as either a contact or proximity mask. In some embodiments, mask 712 is formed of another thin substrate mounted in a fixture similar to fixture 700.

Figure 7D:
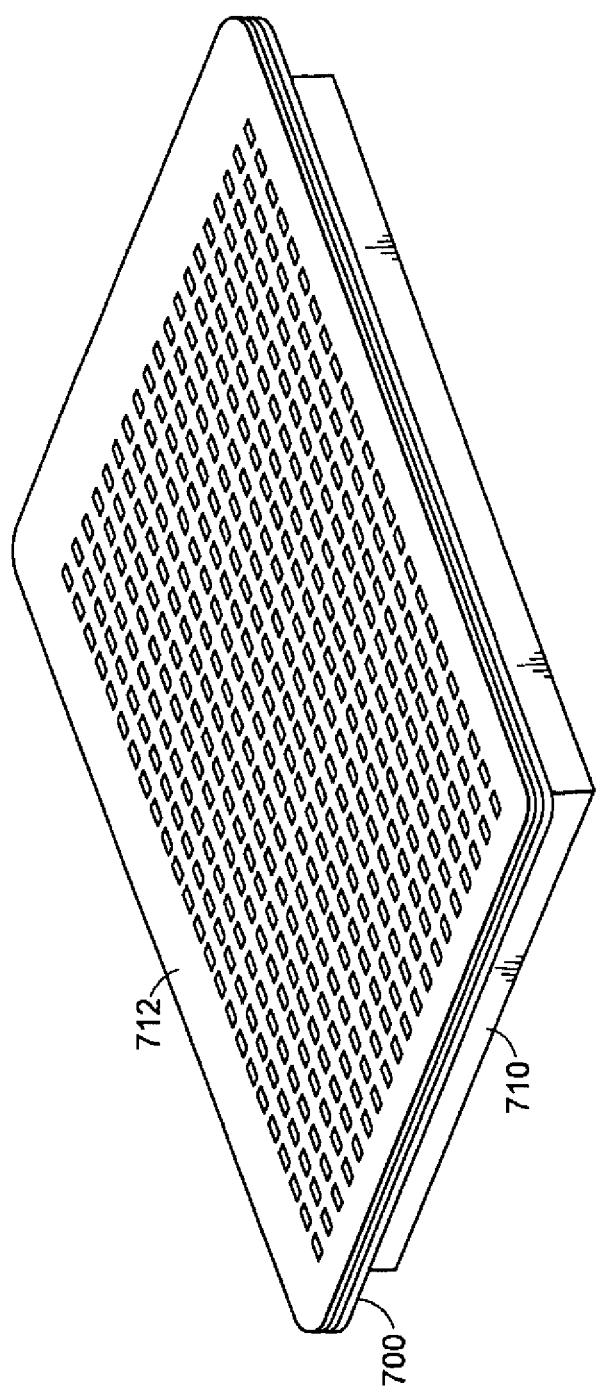

As shown in FIGS. 7C and 7D, fixture 700 and mask 712 can be positioned relative to mount 710. Mount 710, for example, can be a susceptor, mount, or an electrostatic chuck of a processing chamber such as that shown in FIGS. 1A and 1B. Fixture 700 and mask 712 can have features that allow for ready alignment with respect to each other and with respect to mount 710. In some embodiments, mask 712 is resident in the processing chamber and aligned with fixture 700 during positioning of fixture 700 on mount 710, as shown in FIG. 7D.

Utilizing fixture 700 as shown in FIGS. 7A, 7B, 7C, and 7D allows processing of a thin film substrate in a processing chamber. In some embodiments, thin film substrates can be about 10 µm or more. Further, thin film substrate 601, once mounted within fixture 700, can be handled and moved from process chamber to process chamber. Therefore, a multiprocessor chamber system can be utilized to form stacks of layers, including one or more layers of LiCoO₂ deposited according to embodiments of the present invention.

Figure 8:
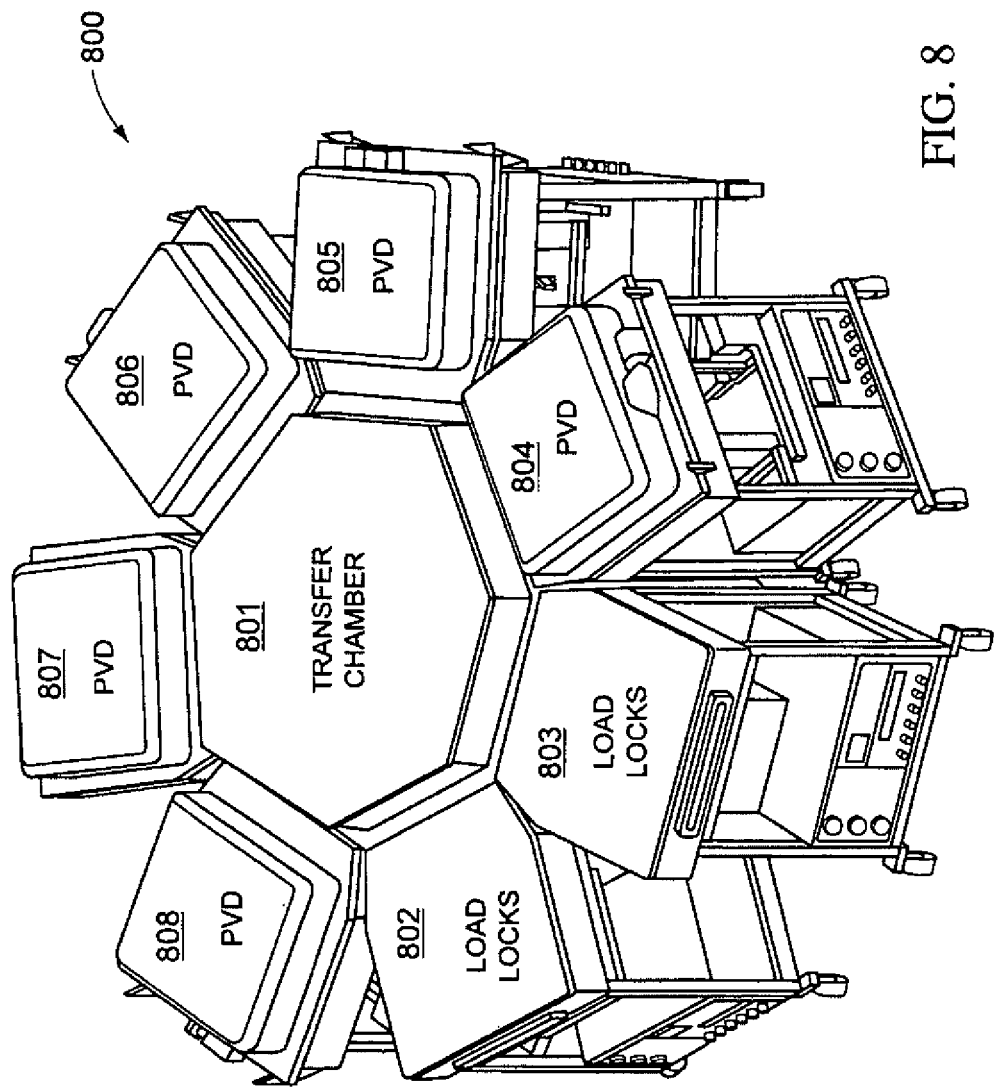
FIG. 8 illustrates a cluster tool that can be utilized to form batteries with $LiCoO_2$ layers deposited according to some embodiments of the present invention.

FIG. 8 illustrates a cluster tool 800 for processing thin film substrates. Cluster tool 800 can, for example, include load lock 802 and load lock 803, through which mounted thin film substrate 601 is loaded and a resultant device is removed from cluster tool 800. Chambers 804, 805, 806, 807, and 808 are processing chambers for depositions of materials, heat treatments, etchings, or other processes. One or more of chambers 804, 805, 806, 807, and 808 can be a pulsed-DC PVD chamber such as that discussed above with respect to FIGS. 1A and 1B and within which a LiCoO₂ film deposited according to embodiments of the present invention may be deposited.

Processing chambers 804, 805, 806, 807, and 808 as well as load locks 802 and 803 are coupled by transfer chamber 801. Transfer chamber 801 includes substrate transfer robotics to shuttle individual wafers between processing chambers 804, 805, 806, 807, and 808 and load locks 802 and 803.

In production of a conventional thin-film battery, ceramic substrates are loaded into load lock 803. A thin metallic layer can be deposited in chamber 804, followed by a LiCoO₂ deposition performed in chamber 805. The substrate is then removed through load lock 803 for an in-air heat treatment external to cluster tool 800. The treated wafer is then reloaded into cluster tool 800 through load lock 802. A LiPON layer can be deposited in chamber 806. The wafer is then again removed from cluster tool 800 for deposition of the lithium anode layer, or sometimes chamber 807 can be adapted to deposition of the lithium anode layer. A second metallic layer is deposited in chamber 808 to form a charge collector and anode collector. The finished battery structure is then off-loaded from cluster tool 800 in load lock 802. Wafers are shuttled from chamber to chamber by robotics in transfer chamber 801.

A battery structure produced according to the present invention could utilize thin film substrates loaded in a fixture such as fixture 700. Fixture 700 is then loaded into load lock 803. Chamber 804 may still include deposition of a conducting layer. Chamber 805 then includes deposition of a LiCoO₂ layer according to embodiments of the present invention. A LiPON layer can then be deposited in chamber 806. Chamber 807 may still be adapted to deposition of a lithium rich material such as lithium metal and chamber 808 can be utilized for deposition of the conducting layer of the current collector. In this process, no heat treatment is utilized to crystallize the LiCoO₂ layer.

Another advantage of a thin film battery process is the ability to stack battery structures. In other words, substrates loaded into cluster tool 800 may traverse process chambers 804, 805, 806, 807, and 808 multiple times in order to produce multiply stacked battery structures. FIGS. 9A and 9B illustrate such battery structures.

FIG. 9A illustrates a parallel coupled stacking. As shown in FIG. 9A, a substrate 601, which for example can be a plastic substrate, is loaded into load lock 803. A conducting layer 603, for example about 2 µm of aluminum, copper, iridium or other material, acts as a bottom current collector. Conducting layer 603, for example, can be deposited in chamber 804, A LiCoO₂ layer 602 is then deposited on conducting layer 603. LiCoO₂ layer 602 can be about 3-10 µm and can be deposited in chamber 805 according to embodiments of the present invention. The wafer can then be moved to chamber 806 where a LiPON layer 901 of thickness of about 0.5 to about 2 µm can be deposited. In chamber 807, an anode layer 902, for example a lithium metal layer of up to about 10 µm, can then be deposited in chamber 807. A second conducting layer 903 can then be deposited over anode layer 902. A second battery stack can then be deposited over the first battery stack formed by metal layer 603, LiCoO2 layer 602, LiPON layer 901, lithium layer 902, and current collection conduction layer 903. Over current collection conducting layer 903, another lithium layer 902 is formed. Another LiPON layer 901 is formed over lithium layer 902. Another LiCoO2 layer 602 is formed over LiPON layer 901 and finally another metal layer 603 is formed over LiCoO2 layer 602. In some embodiments, further stackings can be formed. In some embodiments, metal layers 603 and 903 differ in the mask utilized in deposition so that tabs are formed for electrical coupling of layers.

As discussed above, any number of individual battery stacks can be formed such that parallel battery formations are formed. Such a parallel arrangement of battery stacking structure can be indicated as Current collector/LiCoO2/ LiPON/Anode/current collector/Anode/LiPON/LiCoO2/ current collector/LiCoO2 . . . /current collector. FIG. 9B illustrates an alternative stacking corresponding to the battery structure current collector/LiCoO2/LiPON/anode/current collector/LiCoO2/LiPON/anode/current collector . . . /current collector. In this case, a series arrangement battery stacking structure is formed because the individual battery stacks share anodes.

To form the structures shown in FIGS. 9A and 9B, substrates are rotated again through the chambers of cluster tool 800 in order to deposit the multiple sets of batteries. In general, a stack of any number of batteries can be deposited in this fashion.

In some embodiments, stoichiometric $LiCoO_2$ can be deposited on iridium. FIGS. 10A through 10D illustrate an anneal procedure for Li—Co deposition over an iridium layer that has been deposited on a Si wafer. The $LiCoO_2$ deposition was accomplished as discussed above with a target power of 2 kW, no bias power, reverse time of 1.6 μs, a pulsing frequency of 300 kHz, with 60 sccm Ar flow and 20 sccm of $O_2$ flow, with to pre-heat for 7200 sec. As a result, a layer of $LiCoO_2$ of about 1.51 μm was deposited.

FIGS. 10A through 10D show XRD analysis of both as-deposited and annealed layers of $LiCoO_2$ deposited as discussed above. The XRD analysis of the as-deposited layer demonstrates a shallow peak at $2\theta=18.85°$ denoting a <003> orientation of crystalline $LiCoO_2$, a sharper peak at about $2\theta=38.07°$ corresponding with the desired <101> crystallographic direction, and a peak at $2\theta=40.57°$ corresponding to the <111> direction of iridium. However, the position of the <101> $LiCoO_2$ peak indicates that the <101> $LiCoO_2$ peak is nonstoichiometric $LiCoO_2$. In order to be useful as a battery layer, stoichiometric $LiCoO_2$ provides for the best Li transport. One of ordinary skill in the art will notice that careful adjustment of deposition parameters can provide stoichiometric $LiCoO_2$ of desired orientation.

FIG. 10B shows an XRD analysis of the sample shown in FIG. 10A after a 300° C. anneal in air for 2 hours. As shown in FIG. 10B, the XRD peak corresponding to <003> $LiCoO_2$ grows, indicating crystallization of $LiCoO_2$ into the <003> direction. Further, the <101> peak of $LiCoO_2$ shifts slightly to $2\theta=38.53°$, indicating a more stoichiometric crystallization of the <101> $LiCoO_2$. However, the crystalline $LiCoO_2$ is still not stoichiometric after this anneal. One of ordinary skill in the art will notice that longer anneals and/or further adjustment of the deposited stoichiometry may result in usefully oriented stoichiometric $LiCoO_2$ layers with anneal temperatures at 300° C. or less. Consequently, low temperature materials such as polymers, glass, or metal may be utilized as the substrate.

FIG. 10C illustrates an XRD analysis from the sample after a subsequent 500° C. anneal in air for 2 hours. As shown in FIG. 10C, more of the $LiCoO_2$ crystallizes into the <003> layer. Further, the <101> $LiCoO_2$ peak shifts again to $2\theta=39.08°$, indicating crystallization of a <012> layer of $LiCoO_2$. In this case, the <012> $LiCoO_2$ crystal is stoichiometric and therefore allows for efficient Li transport. One of ordinary skill in the art will notice that longer anneals and/or further adjustment of the deposited stoichiometry may result in usefully oriented stoichiometric $LiCoO_2$ layers with anneal temperatures at 500° C. or less. Consequently, low temperature materials such as polymers, glass, or metal may be utilized as the substrate.

FIG. 10D illustrates an XRD analysis of the sample after a subsequent anneal of 700° C. in air for 2 hours. As shown in FIG. 10D, the <003> $LiCoO_2$ peak disappears, but the <012> $LiCoO_2$ peak remains relatively the same as that shown in the 500° anneal illustrated in FIG. 10C.

FIGS. 10A through 10D demonstrate deposition of <101> $LiCoO_2$ at low temperature over an iridium layer. Subsequent anneals to 500° C. may be desired to change the stoichiometry of the <101> $LiCoO_2$ layer, but anneals to 700° C. do not appear to be necessary. With anneal temperatures less than 500° C., depositions of a $LiCoO_2$ layer over a conducting iridium layer can be accomplished on glass, aluminum foil, plastic, or other low temperature substrate material. Anneal temperatures of less than 500° C. but greater than 300° C. or lengthening the time of lower temperature anneals may also result in desired orientations of stoichiometric crystalline $LiCoO_2$.

Figure 11A:
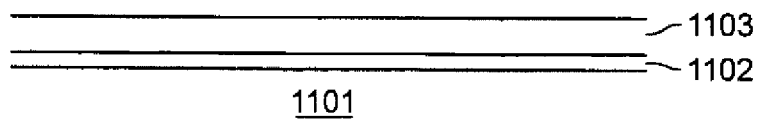
FIGS. 11A through 11D illustrate a single layer battery formed over an iridium layer according to some embodiments of the present invention.

FIGS. 11A through 11D illustrate formation of a single-layer battery according to some embodiments of the present invention. As shown in FIG. 11A, a lift-off layer 1102 can be deposited on a substrate 1101. Further, an iridium layer 1103 can be deposited over lift-off layer 1102. In some embodiments, substrate 1101 can be plastic, glass, Al foil, Si wafer, or any other material. Lift-off layer 1102 can be any lift off layer and can be a polymer layer such as polyimide, an inorganic layer such as $CaF_2$ or carbon, or an adhesive layer that loses its adhesion as a result of, for example, oxidation, heat, or light. Lift-off layers are well known. Iridium layer 1103 can be from about 500 Å or more.

Figure 11B:
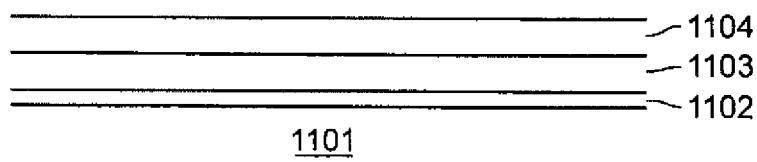

As shown in FIG. 11B, a $LiCoO_2$ layer is deposited over iridium layer 1103 as was discussed above. In some embodiments, an anneal can be performed at this step. In some embodiments, further layers of the battery may be deposited before an anneal step is performed. In some embodiments, a stoichiometric $LiCoO_2$ layer of a useful crystalline orientation may result in the as-deposited $LiCoO_2$ with no further anneals necessary.

Figure 11C:
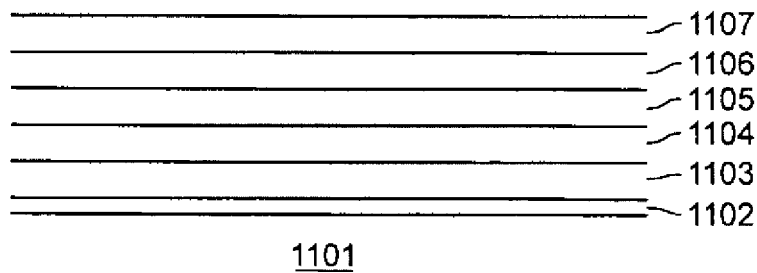

FIG. 11C illustrates deposition of a LiPON layer 1105 over the $LiCoO_2$ layer, deposition of a Li layer 1106 over LiPON layer 1105, and deposition of an electrode layer 1107 over Li layer 1106. In some embodiments, an anneal step of up to 500° C. as discussed above may be performed here.

Figure 11D:

As shown in FIG. 11D, the resulting single-layer battery formed from iridium layer 1103, $LiCoO_2$ layer 1104, LiPON layer 1105, Li layer 1106, and electrode layer 1107 can be "lifted off" from substrate 1101. Such a single-layer battery can be a free-standing battery of thickness about 5 μm or greater. Such a battery, without the requirement of a substrate 1101, is well known to have the potential of energy storage of greater than about 1 kW-hr/liter.

As an alternative to a lift-off process as described in FIGS. 11A through 11D, a substrate may be removed during anneal leaving a single-layer battery. Further, in some embodiments, substrate 1101 can be removed by a solvent, etching, or a photo process. Further, single-layer batteries may be combined or stacked in any fashion to provide a device of greater energy storage at a particular voltage.

Figure 12:
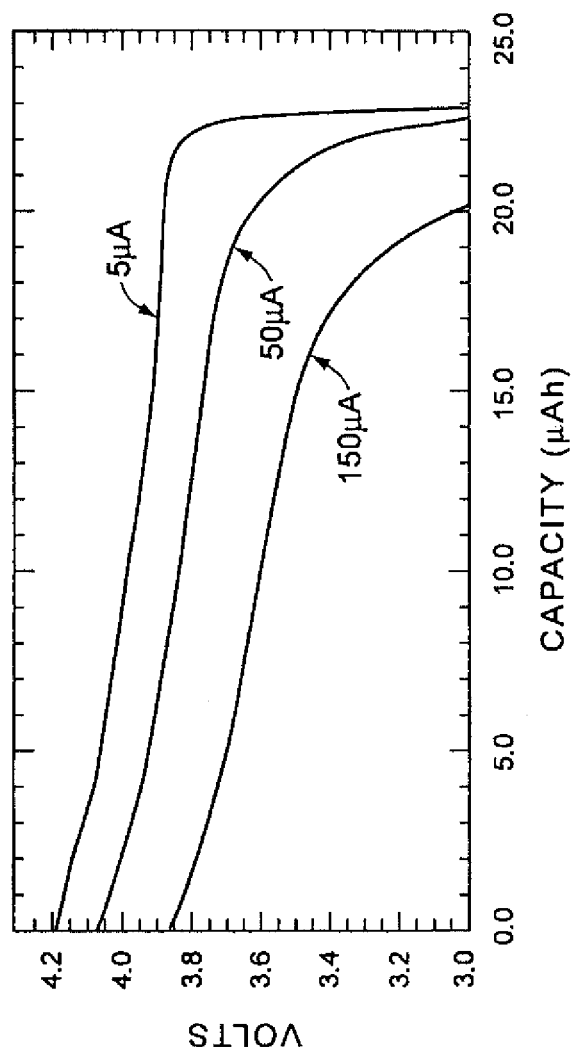
FIG. 12 illustrates battery performance utilizing films deposited according to some embodiments of the present invention.

FIG. 12 illustrates performance of a battery structure such as that shown in FIGS. 9A and 9B with a $LiCoO_2$ film deposited according to the present invention. The film was annealed at 700 C. for a 2 hour period and characterized by Oakridge Microenergy, Inc., of Oakridge, Tenn.

One skilled in the art will recognize variations and modifications of the examples specifically discussed in this disclosure. These variations and modifications are intended to be within the scope and spirit of this disclosure. As such, the scope is limited only by the following claims.

TABLE I

| Example # | Target Power (kW) | Bias Power (W) | Reverse Time (μs) | Frequency (kHz) | Ar (sccm) | $O_2$ (sccm) | Initial Substrate Temperature (temperature during deposit) (° C.) | Deposition Time (sec) | Film Thickness (μm) |
|---|---|---|---|---|---|---|---|---|---|
| 1 | 2 | 0 | 1.6 | 250 | 80 | 0 | 30 | 10000 | 3.9 |
| 2 | 2 | 0 |  | 250 | 72 | 8 | 30 | 7200 | 1.7 |
| 3 | 2 | 100 |  | 250 | 72 | 8 | 30 | 7200 | 1.34 |
| 4 | 2 | 100 |  | 250 | 76 | 4 | 30 | 7200 | 1.57 |
| 5 | 2 | 100 |  | 250 | 76 | 4 | 200 | 7200 | 1.3 |
| 6 | 2 | 100 |  | 250 | 74 | 6 | 200 | 7200 | 1.3 |
| 7 | 2 | 0 |  | 300 | 72 | 8 | 30 | 7200 | 1.58 |
| 8 | 2 | 0 |  | 300 | 74 | 6 | 30 | 7200 |  |
| 9 | 2 | 100 |  | 300 | 74 | 6 | 30 | 7200 |  |
| 10 | 2 | 100 |  | 300 | 72 | 8 | 30 | 7200 |  |
| 11 | 2 | 100 |  | 300 | 70 | 10 | 30 | 7200 |  |
| 12 | 2 | 0 |  | 300 | 70 | 10 | 30 | 7200 |  |
| 13 | 2 | 0 |  | 300 | 72 | 8 | 30 | 7200 | 1.58 |
| 14 | 2 | 0 |  | 300 | 74 | 6 | 30 | 7200 |  |
| 15 | 2 | 0 |  | 300 | 60 | 20 | 30 | 7200 |  |
| 16 | 2 | 0 |  | 300 | 50 | 30 | 30 | 7200 |  |
| 17 | 2 | 200 |  | 300 | 60 | 20 | 30 | 7200 |  |
| 18 | 2 | 50 |  | 300 | 60 | 20 | 30 | 7200 |  |
| 19 | 2 | 0 |  | 300 | 70 | 10 | 30 | 7200 |  |
| 20 | 2 | 0 |  | 300 | 65 | 15 | 30 | 7200 |  |
| 21 | 3 | 0 |  | 300 | 65 | 15 | 30 | 7200 |  |
| 22 | 2 | 0 | 1.6 | 250 | 60 | 20 | 30 | 7200 |  |
| 23 | 3 | 0 | 1.6 | 250 | 60 | 20 | 30 | 7200 |  |
| 24 | 2 | 0 | 1.6 | 250 | 60 | 20 | 30 (NPH) | 7200 |  |
| 25 | 2 | 0 | 1.6 | 250 | 60 | 20 | 10 min heat 30 min coc | 7200 |  |
| 26 | 2 | 0 | 1.6 | 250 | 60 | 20 | no preheat | 9000 |  |
| 27 | 2 | 0 |  | 300 | 60 | 20 | no preheat | 7200 |  |
| 28 | 2 | 0 |  | 300 | 60 | 20 | 15 min heat, 10 min | 7200 |  |
| 29 | 2 | 0 |  | 250 | 60 | 20 | no preheat. | 7200 |  |
| 30 | 2 | 0 |  | 250 | 60 | 20 | 10 min, 10 min |  |  |

TABLE II

| Example # | Phase | Lattice | Texture | $d_{101}$ [Å] | 2θ [°] | crystallite size [Å] |
|---|---|---|---|---|---|---|
| 15 | $LiCoO_2$ | rhombohedral | strong [101] | 2.376(1) | 37.83 | ~1300 |
| 16 | $LiCoO_2$ | Rhombohedral | strong [101] | 2.375(1) | 37.85 | ~750 |
| 17 | Co | cubic | random | — | — | <50 |
| 18 | Co | cubic | random | — | — | <50 |
| 19 | $LiCoO_2$ | rhombohedral | strong [101] | 2.370(1) | 37.93 | ~1400 |
| 20 | $LiCoO_2$ | rhombohedral | strong [101] | 2.372(1) | 37.90 | ~1500 |
| 21 | $LiCoO_2$ | rhombohedral | strong [101] | 2.370(1) | 37.92 | ~1700 |
| PDF | $LiCoO_2$ | Rhombohedral | random | 2.408(1) | 37.31 | — |

What is claimed is:

1. A method of producing a battery, comprising:
   positioning a substrate between a top portion and a bottom portion of a fixture;
   attaching a mask to the fixture;
   loading the fixture holding the substrate into a cluster tool via a load lock;
   and
   depositing a crystalline $LiCoO_2$ layer over a conducting layer in a chamber of the cluster tool with a pulsed DC PVD process, the conducting layer being deposited over the substrate.

2. The method of claim 1, wherein depositing a crystalline $LiCoO_2$ layer includes depositing crystalline $LiCoO_2$ through the mask.

3. The method of claim 1, further including depositing a conducting layer on the substrate.

4. The method of claim 1, further including depositing a LiPON layer over the $LiCoO_2$ layer.

5. The method of claim 4, further including depositing an anode over the LiPON layer.

6. The method of claim 5, further including depositing a conducting layer over the anode.

7. The method of claim 1, wherein the conducting layer is an iridium layer.

8. The method of claim 1, further including lifting off the battery from the substrate.

9. The method of claim 1, wherein depositing the crystalline $LiCoO_2$ layer includes:

flowing a gaseous mixture including argon and oxygen through the chamber;

applying pulsed DC power to a densified conductive ceramic $LiCoO_2$ sputter target having a resistivity in a range from about 3 kΩ to about 10 kΩ, the densified conductive ceramic $LiCoO_2$ sputter target including Li and Co oxides, Li and Co metallic additions, and at least one dopant of Ni, Si, or Nb;

applying an RF bias power to the substrate; and depositing the crystalline $LiCoO_2$ layer including a columnar structure.

10. The method of claim 1, further comprising:

loading the substrate into the load lock of the cluster tool;

transferring the substrate from the load lock to a transfer chamber of the cluster tool, the transfer chamber being coupled to the load lock and the chamber for depositing the crystalline $LiCoO_2$ layer; and transferring the substrate from the transfer chamber to the chamber for depositing the crystalline $LiCoO_2$ layer.

11. A method of making a battery using a cluster tool, comprising:

positioning a substrate between a top portion and a bottom portion of a fixture;

attaching a mask to the fixture;

loading the fixture holding the substrate into the cluster tool via a load lock;

depositing a crystalline $LiCoO_2$ layer over the substrate in a first processing chamber of the cluster tool, the substrate being loaded into the cluster tool via the load lock of the cluster tool;

depositing a LiPON ($Li_xPO_yN_z$) layer over the crystalline $LiCoO_2$ layer in a second processing chamber of the cluster tool; and depositing an anode layer over the LiPON ($Li_xPO_yN_z$) layer in a third processing chamber of the cluster tool, wherein the substrate is transferred among the first, second and third processing chambers and the load lock using a transfer chamber of the cluster tool, the transfer chamber being coupled to the first, second and third processing chambers and the load lock in the cluster tool.

12. The method of claim 11, further comprising:

depositing a first conducting layer between the substrate and the crystalline $LiCoO_2$ layer in a fourth processing chamber of the cluster tool; and depositing a second conducting layer over the anode layer in a fifth processing chamber of the cluster tool, wherein the substrate is transferred among the first, second, third, fourth and fifth processing chambers and the load lock using the transfer chamber of the cluster tool.

13. The method of claim 11, further comprising:

after depositing the crystalline $LiCoO_2$ layer, transferring the substrate with the deposited crystalline $LiCoO_2$ layer out of the cluster tool via the load lock;

annealing the deposited crystalline $LiCoO_2$ layer at less than about 500° C. in air;

transferring the substrate with the deposited crystalline $LiCoO_2$ layer into the cluster tool via the load lock.

* * * * *